United States Patent [19]

Lawrence

[11] Patent Number: 5,131,979
[45] Date of Patent: Jul. 21, 1992

[54] SEMICONDUCTOR EPI ON RECYCLED SILICON WAFERS

[75] Inventor: John E. Lawrence, Cupertino, Calif.

[73] Assignee: Lawrence Technology, Cupertino, Calif.

[21] Appl. No.: 703,368

[22] Filed: May 21, 1991

[51] Int. Cl.$^5$ .............. H01L 21/306; B44C 1/22; C03C 15/00; C23F 1/00

[52] U.S. Cl. .............. 156/655; 156/636; 156/645; 156/656; 156/657; 156/662

[58] Field of Search .............. 156/636, 645, 655–657, 156/662

[56] References Cited

U.S. PATENT DOCUMENTS 3,600,241  8/1971  Doo et al. .............. 156/662 X
3,923,567 12/1975  Lawrence .............. 156/657 X

*Primary Examiner*—William A. Powell
*Attorney, Agent, or Firm*—Steven F. Caserza

[57] ABSTRACT

Disclosed is a method for transforming a rejected semiconductor product wafer, originally having epitaxial silicon on a low resistivity substrate, into a recycled EPI-on-silicon wafer targeted for reuse as a lower cost higher quality material suitable for new semiconductor product fabrication. The method comprises the steps of removing the old semiconductor product layers, rounding the edges of the wafer if necessary, polishing the wafer surface, thermally treating the wafer to drive lattice imperfections from the surface to create fresh inpurity getter sites in the wafer body, and introducing a new epitaxial silicon layer. The low cost feature is provided by the reuse of the original substrate wafer. The high quality feature is provided by the targeted redistribution of oxygen induced defects from the recycled substrate wafer surface.

10 Claims, 1 Drawing Sheet

SEMICONDUCTOR EPI ON RECYCLED SILICON WAFERS

BACKGROUND OF THE INVENTION

1. Field of the Invention

This invention relates generally to a method for transforming a rejected semiconductor product wafer into a recycled EPI-on-substrate wafer suitable for new product fabrication. More particularly the invention relates to the introduction of an epitaxial silicon layer to a heavily doped substrate, the latter of which has been modified by a novel procedure to assure its ability to provide for high performance semiconductor products.

2. Description of the Prior Art

In the early 1970's, when the first semiconductor wafer recycling patents were issued, the silicon wafers used for semiconductor product fabrication were generally created by the Czochralski method to have grown-in oxygen less that 29 ppm. This feature gave the silicon material a high critical shear strength to minimize process stress induced dislocations. Such wafers could be recycled and used again as a replacement material for the more expensive virgin silicon. At times, the less expensive recycled wafers provided higher semiconductor product yields than their expensive virgin wafer alternative.

However after the mid-1970's, the same silicon wafers prepared by the Czochralski method were targeted to have grown-in oxygen at a much higher level, near 32 to 40 ppm. This higher oxygen content contributed to a desired development of crystal lattice imperfections, such as stacking faults and dislocation loops, in the wafer body. Such lattice imperfections in the wafer's interior contribute to higher semiconductor product yields by gettering mobile impurities away from the product's active electronic components near the front wafer surface. This phenomena is called Intrinsic Gettering. Included in the phenomena of Intrinsic Gettering is a recognition that a defect-free zone, or Denuded Zone, must be created near the wafer surface.

The act of recycling a rejected semiconductor wafer by the present industry standard procedure (U.S. Pat. No. 3,923,567) will always remove the narrow Denuded Zone that separates the semiconductor product's active components from the interior lattice imperfections. This removal of the wafer's Denuded Zone makes the resulting recycled silicon wafer unsuitable for future semiconductor product fabrication, unless a method is found to recreate a new defect-free Denuded Zone. This fact has not been addressed in the prior art. A recycled silicon wafer with lattice imperfections at the surface would not yield salable semiconductor products due to the products' having excessive PN junction leakage current. Such prior art recycled wafers are being used successfully as lower valued process monitor wafers.

This invention recognizes the semiconductor industry's requirement for a procedure by which rejected product wafers that originated as epitaxial silicon on low (e.g. less than approximately 1$\phi$cm) resitivity substrate wafers could be recycled. Such recycled wafers can not be used for process monitor applications because of their low resistivity. The semiconductor industry will be using increasing numbers of these wafers for product fabrication in the future because they are required for high performance applications. It would be desirable to provide a method to recycle a low resistivity substrate wafer back to future use that is highly valued by the semiconductor industry.

SUMMARY OF THE INVENTION

It is one objective of the present invention to provide a procedure for recycling a rejected semiconductor wafer which removes the old defective product structure and creates a new defect-free semiconductor quality epitaxial silicon layer grown on the recycled wafer substrate.

Another objective of the invention is to modify the material features of the old recycled substrate wafer to create a wide defect-free Denuded Zone near the surface, fresh imperfections in the wafer's interior to getter impurities, and redistribute unwanted impurities away from the wafer's front product surface.

In accordance with this invention, a rejected semiconductor product wafer begins the procedure that will eventually transform it into a recycled epitaxial wafer suitable for new product fabrication by being stripped of all old product layers down to the original substrate material. This is performed chemically and/or by mechanical grinding. The chemical option is preferred because it alone controls the wafer thickness better and does not introduce new lattice strain to the old crystalline substrate wafer. If the grind option is used, the wafer is preferably chemically etched after the grinding to remove the newly introduced lattice strain.

After the old defective product structure is removed and the wafer is now stripped "down" to the original substrate lattice, the wafer preferably receives an edge rounding treatment. This is performed automatically in a well known manner using, for example, the same industry standard equipment used by the manufacturers of virgin silicon wafers. If desired, this edge rounding step is omitted, for example, when the amount of silicon required to remove the old defective product is less than about eight microns. This is possible because the original wafer edge curvature remains adequate to prevent wafer edge "lips" from forming when the new thin epitaxial layer is introduced.

After substrate wafer edge rounding, the recycled wafer is polished to form a defect-free flat mirror-like surface. The wafers entering this step are preferably first placed into tight thickness groupings, to assure a minimum amount of silicon is removed from the wafer during the polishing step. A polishing slurry, for example a slurry similar to silica spiked to increase its pH to about 11.5, is used to create a defect-free mirror-like surface.

After the wafer polishing step, the wafers are thermally treated to create a reconstructed Denuded Zone and enhanced interior lattice getter sites development. The first act of this step is to heat the wafer to a temperature of approximately 1200° C. or higher in an oxygen, with chlorine, ambient. The high temperature and the $O_2$/Cl ambient contributes to the wafer surface lattice developing a Denuded Zone that approaches a defect-free character. The at-temperature time is preferably two to four hours. However, a longer time often contributes to better defect-free results. A slow push and pull time for the wafers entering and leaving the high temperature furnace is helpful to avoid the formation of thermal stress induced lattice defects. The concentration of chlorine in the oxygen ambient is, for example, about 1%.

After the high temperature furnace treatment, the wafers are placed in a low temperature furnace at approximately 600° to 750° C. for two to four hours to make "permanent" the redistribution of impurities and lattice imperfections. A greater benefit is often derived from this low temperature treatment if the time is extended. The furnace ambient is preferably relatively inert, such as nitrogen.

After the low temperature treatment, the wafers are stripped of oxide. This is followed by a scrub of the wafer surface and epitaxial silicon layer growth. The growth of the epitaxial layer is preferably performed at a temperature somewhat below 1120° C. The growth rate is preferably rapid to minimize the out-diffusion of the substrate dopant. A wide range of epitaxial layer doping level and thickness are possible in keeping with the requirements of the semiconductor product to be constructed in the epitaxial layer on the recycled substrate.

An advantage of this invention is that it designs in all of the specific steps that must be followed to reliably recycle a rejected semiconductor product wafer for future use as a virgin prime epitaxial wafer replacement.

Another advantage of this invention is that it introduces thermal treatments to the recycled wafer that contribute to the finished wafer as having superior features with respect to defect-free EPI and the gettering of unwanted impurities into the body of the wafer away from the semiconductor product surface.

Other objects and advantages will be apparent to those skilled in the art after having read the following detailed disclosure which makes reference to the several figures of the drawings.

DETAILED DESCRIPTION OF THE PREFERRED EMBODIMENTS

Figure 1:
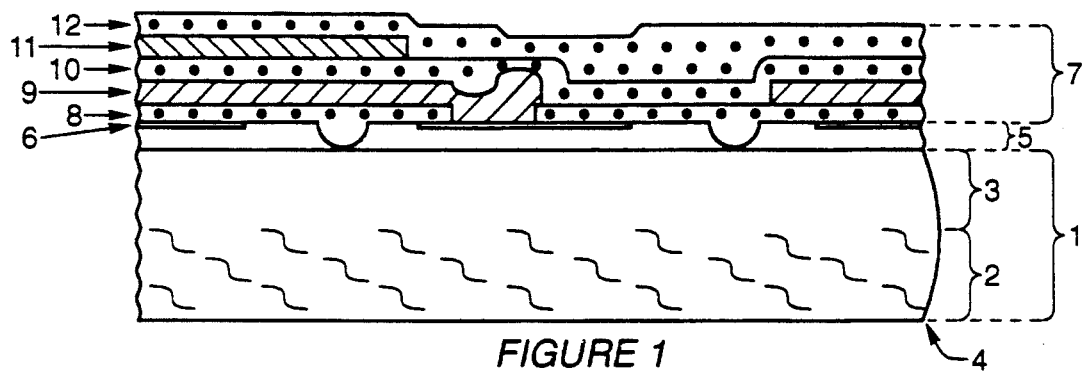
FIG. 1 is a schematic representation of a defective semiconductor product including several external conducting and insulting layers as the wafer is received prior to being recycled to prime quality with an epitaxial layer in accordance with the present invention.

This invention describes a procedure by which a rejected semiconductor product wafer that originated as epitaxial silicon on a low resistivity substrate can be restored, with material upgrades, for future use by the semiconductor industry to manufacture the most state-of-the-art products. Fundamental to this invention is the process that redistributes oxygen induced lattice imperfections in the recycled substrate to the interior of the wafer, thus creating a new Denuded Zone and fresh lattice imperfections in the wafer interior for the gettering attraction of unwanted impurities away from the product's electrically active components.

The recycled wafer may lose some of its required edge rounding during the act of removing the old defective semiconductor product. The growth of an epitaxial layer on a wafer with inadequate edge rounding may result in the wafer having the epitaxial silicon grow sufficiently faster at the wafer's edge to create a raised "lip". This cannot be allowed because a "lip" of silicon at the wafer's edge often leads to wafer breakage. This quality limiting problem is addressed by including a wafer edge recontouring step.

In recognition of the need to redevelop a Denuded Zone and fresh getter sites in the wafer's interior, this embodiment describes a high temperature process that is designed to redistribute the wafer's original grown-in oxygen and its associated lattice imperfections from the recycled wafer surface to the interior of the wafer. The specified use of chlorine, oxygen, and nitrogen in the high temperature furnace ambient facilitates the desired reactions. By raising the temperature of the recycled wafer, oxygen and other precipitated impurities go into solution, thus facilitating their controlled redistribution. In addition, the raised wafer temperature increases the energy in the crystal lattice, thus facilitating the annihilation and redistribution of lattice imperfections in the surface lattice to create a new Denuded Zone. The addition of chlorine to the furnace's oxygen ambient contributes to the wafer's surface lattice acquiring a higher than normal vacancy content. This contributes to the enhanced annihilation of stacking faults and dislocation loop imperfections in the surface lattice. The quality of the new epitaxial silicon layer grown on the reconstructed substrate wafer surface is enhanced by these actions.

This embodiment achieves a further quality advancement built into the recycled wafer by introducing a low temperature step after the high temperature process. The low temperature step contributes to "freezing" the location of the redistributed oxygen and to nucleate fresh lattice imperfections in the wafer's interior that will getter future process induced impurities. The low temperature step also assures the integrity of the newly formed Denuded Zone by having "fixed" the location of the redistributed oxygen and its associated lattice imperfections.

This embodiment recognizes that the growth of an epitaxial silicon layer on the low resistivity substrate requires the normal precautions to avoiding auto doping and the out diffusion of the dopant in the recycled substrate. Accordingly, precautions as using a lower epitaxy deposition temperature and a faster deposition rate are used.

This finished epitaxial layer/recycled substrate wafer has the built-in technical potential of providing for product yields superior to those achieved on its original virgin wafer equivalent, and the recycled wafer is less costly. The quality improvement occurs due to the use of special thermal treatments designed to enhance the development of imperfections in the substrate wafer's interior, create a new Denuded Zone, and redistribute unwanted impurities from the new epitaxial layer. The low cost objective is achieved by the recycling method being far less expensive to perform than the cost of preparing a new substrate.

Rejected semiconductor wafers are generally shipped to a wafer recycling company just as they were withdrawn from a production line. Some reject wafers may have finished products with metal interconnects, while other wafers may have been rejected after only a few processing steps. Referring now to FIG. 1, a semiconductor product wafer's cross section is shown that identifies the spacial relationship of several typical structural layers important to this invention. Original starting wafer 1 as shown to have a region containing a high concentration of oxygen-induced defects 2 and a region consisting of a defect-free Denuded Zone 3. Original wafer 1 has a rounded edge 4 to prevent wafer breakage. Added to original wafer 1 is an epitaxial layer of crystalline silicon 5 that must have a specific thickness and doping resistivity to satisfy the specifications of each semiconductor product. The semiconductor product has patterns of surface doping 6 to satisfy the performance requirements of the product. Such patterns of surface doping 6 may extend down (not shown) through epitaxial layer 5 into the surface of the original wafer 1. The semiconductor product also has layers of conducting and insulating layers 7 added to the surface of epitaxial silicon 5. The layer closest to epitaxial silicon layer 5 is often silicon dioxide 8, followed next by a layer of polycrystalline silicon 9, next by silicon dioxide 10, next by aluminum 11, and finally by silicon dioxide 12. The semiconductor product wafer may also include added layers of conducting materials, such as metal silicides, and added layers of insulating materials, such as silicon nitride. Silicon wafers containing gold as a dopant or as a plated backside metal should not be recycled because gold is a metal likely to contaminate the recycling solutions and fixtures. It should be recognized that all non-gold doped semiconductor wafer structures, such as Bipolar and CMOS, may be recycled by the described process.

In accordance with this invention, the first step in this embodiment of recycling a wafer for future semiconductor product fabrication with an epitaxial layer is to remove the old reject semiconductor product layers down to, and including, the old epitaxial silicon layer 5. This can be done mechanically, by grinding, but the most thorough and controllable method is to immerse the reject semiconductor wafers into a sequence of chemical solutions designed to remove the specific layers, such as: sulfuric acid to remove photoresist, hydrofluoric acid to remove dielectric layers such as silicon dioxide and silicon nitride, a mixture of nitric acid and hydrochloric acid to remove aluminum, and potassium hydroxide or diluted hydrofluoric/nitric acid mixtures to remove silicon. The act of removing the old semiconductor product's component layers leaves the silicon wafer with the rough surface features shown in FIG. 2.

Figure 2:
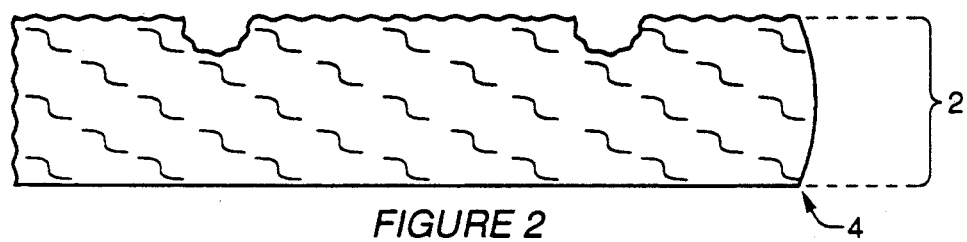
FIG. 2 is a view similar to FIG. 1 after the removal of the old product's layers of external conducting and insulating materials from the rejected wafer.

The in-process recycled wafer shown schematically in FIG. 2 has a rough surface and oxygen induced defects extending from the front to the back surface. The wafer at this stage in the recycling process is typically only about 12 microns, or about 2% thinner than the original prime wafer. The wafer will be subjected to a polishing step to restore the surface to a mirror-like finish. Also, the oxygen-induced crystal lattice defects, represented by wiggly lines in region 2 of FIGS. 1 and 2 will be removed from the front wafer surface to recreate a new defect-free Denuded Zone, much like region 3 in FIG. 1. The act of performing the future wafer frontside polish step removes some of the wafer edge round contour, so it may be desirable to recontour the wafer edges. Once these finished wafer requirements are satisfied, the wafer will be ready for the growth of its new epitaxial layer.

Figure 3:
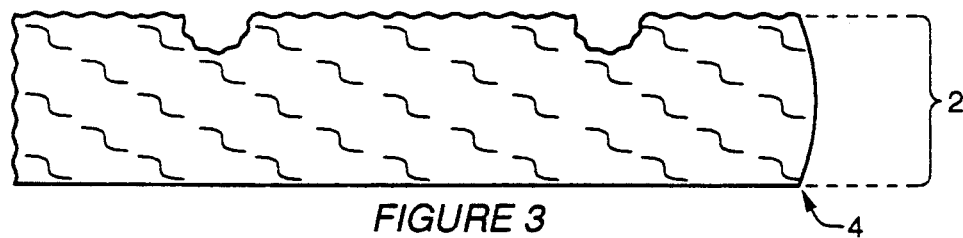
FIG. 3 is a view similar to FIG. 1 after the wafer edge has been rounded.

In accordance with this embodiment, the wafer in the state shown in FIG. 2 might next have its edge contour restored to the shape specified in the semiconductor industry standards for prime product wafers. This act is accomplished by inserting the in-process recycled wafer into automatic wafer edge rounding machinery, of which many manufacturers are available to serve the requirements of the original prime wafer producers. FIG. 3 shows the in-process wafer after its having had its edge recontoured, as depicted by the numerical designation 4. The act of edge rounding is preferably performed at this stage in the wafer recycling process because the front wafer surface is not yet highly polished, and thus wafer front surface scratches or contamination introduced by the edge rounding equipment will not impact the final wafer quality. The wafer recycling process step of edge contouring may be omitted if the original wafer had an epitaxial layer less than about eight microns thick, because a reject wafer retains adequate edge rounding to satisfy the semiconductor industry specification if the original epitaxial layer is thin. If the epitaxial layer was much thicker, the degree of wafer edge rounding would likely be measurably altered because the epitaxial silicon grows faster at the wafer's edge. Preferably, the act of wafer edge rounding is not performed when not required because the resulting wafer may have its diameter reduced beyond the semiconductor industry standards. After the matter of wafer edge rounding has been addressed, the substrate wafer is frontside polished.

Figure 4:
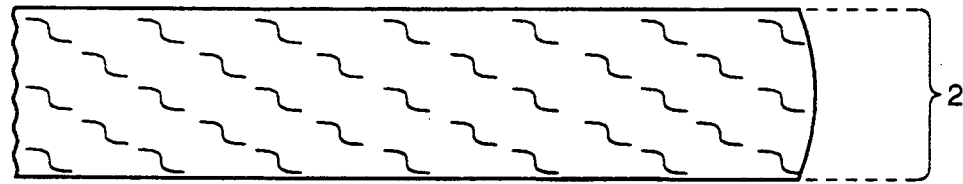
FIG. 4 is a view similar to FIG. 1 after the wafer surface has been polished to a mirror-like finish.

In accordance with this embodiment the in-process recycled wafer now has its frontside polished to a mirror-like finish as represented in FIG. 4. This step follows the edge rounding step, if performed, and precede the process step that reintroduces a Denuded Zone to the recycled wafer. In one embodiment, the frontside polish step is performed in two steps: the Stock Removal step which restores the surface to a flat state, and a Buff Polish step which removes minor scratches from the wafer surface. The Stock Removal polishing step uses, for example, a silica-based slurry that has an alkali material, like NaOH, to raise the slurry pH to a level near 11.4. The Buff Polish step uses, for example, a similar slurry, but with a smaller polishing slurry grit size. Many of the wafers that pass through the recycling procedure taught by this invention have a resistivity below 1 ohm-cm. These wafers are preferably polished using polishing slurries having a lower pH, such as 10.8 to suppress slurry-induced surface pitting. The act of frontside polishing typically removes 25 to 35 microns from the recycled wafer, or about 6% of the original wafer thickness. At this stage, the polished wafer is not yet ready for its epitaxial layer, because the original wafer's oxygen induced lattice defects are in the near vicinity of the wafer's surface, i.e., the wafer has no Denuded Zone.

Figure 5:
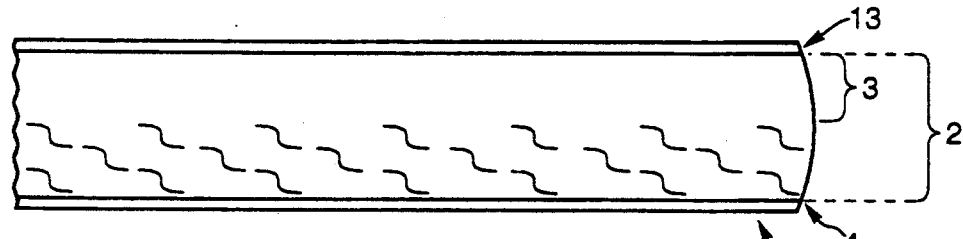
FIG. 5 is a view similar to FIG. 1 after the wafer has been thermally treated to create a defect-free surface, a wide Denuded Zone, fresh internal getter sites, and a redistribution of unwanted impurities into the substrate's interior.

In accordance with this embodiment, a furnace cycle is performed to regenerate a defect-free Denuded Zone near the wafer's front side. This process step follows the frontside polishing step because the act of frontside polishing would likely polish off the regenerated Denuded Zone. In one embodiment, this step in the wafer recycling procedure of this invention has the polished wafers being pushed into a furnace in a nitrogen/oxygen ambient. The temperature of the wafers is then raised to the range of approximately 1,200°–1275° C. where the wafers are subjected to an oxygen/chlorine ambient. The wafers are left in this temperature range for several hours to allow the oxygen-induced crystal lattice defects to leave the front wafer surface. A layer of oxide is formed which keeps the polished silicon surface clean. The furnace temperature is then slowly ramped to a temperature near about 750° C. The wafers remain at approximately 750° C. for a few hours in nitrogen to allow the redistributed oxygen to nucleate new lattice defects away from the wafer surface. FIG. 5 shows a sketch of a recycled wafer as it leaves the furnace. The silicon wafer is noted by 2, the restored Denuded Zone is noted by 3, and the newly grown oxide layer is noted by 13. The recycled wafer is now ready for the final step of growing the new epitaxial layer.

Figure 6:
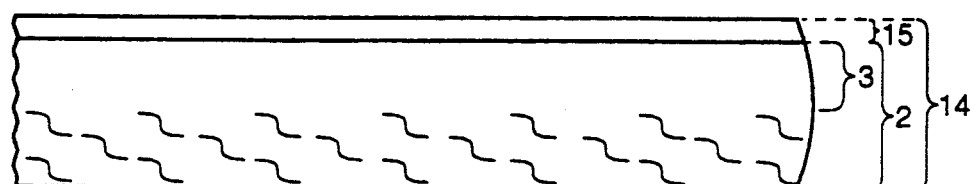
FIG. 6 is a view similar to FIG. 1 after a new layer of epitaxial silicon has been introduced.

In accordance with this embodiment, the specially treated wafer with its newly formed Denuded Zone and protective oxide layer is immersed into hydrofluoric acid to remove oxide layer 13. This is followed by the wafer being scrubbed clean and final insertion into an epitaxial reactor for the growth of the epitaxial silicon layer. The epitaxial silicon layer that is grown must satisfy the thickness and resistivity requirements of the semiconductor company that will utilize the finished wafer. FIG. 6 shows the final recycled wafer 14 with its components: new epitaxial silicon layer 15, recycled wafer substrate 2, and restored Denuded Zone 3.

Although this invention has been described using silicon technology, one skilled in the art will recognize that the process may be utilized in recycling other semiconductor materials such as germanium or III-V compound semiconductor materials. In addition, it will be recognized that this invention is directed toward a novel process for recycling a semiconductor wafer which includes the reconstruction of a defect-free Denuded Zone and new bulk lattice gettering sites via the redistribution of grown-in oxygen. With this sequence of steps, recycled wafers with a new epitaxial layer can be made less expensively and provide an improved probability of yielding a higher percentage of good performing products.

While there has been described what is at present considered to be preferred embodiments of the invention, it will be understood that various modifications may be made therein, and it is intended to cover in the appended claims all such modifications as fall within the true spirit and scope of the invention.

All publications and patent applications cited in this specification are herein incorporated by reference as if each individual publication or patent application were specifically and individually indicated to be incorporated by reference.

Although the foregoing invention has been described in some detail by way of illustration and example for purposes of clarity of understanding, it will be readily apparent to those of ordinary skill in the art in light of the teachings of this invention that certain changes and modifications may be made thereto without departing from the spirit or scope of the appended claims.

What is claimed is:

1. A method of reclaiming a semiconductor wafer comprising the steps of:
    stripping all layers from said wafer which had been added to the original wafer to construct the rejected semiconductor product;
    reestablishing said wafer's edge rounded contour;
    repolishing said wafer's front surface;
    redistributing the oxygen induced defects in said wafer's lattice to create a new defect-free Denuded Zone near said wafer's front surface and fresh getter sites in the bulk lattice of said wafer to getter impurities; and
    forming a fresh layer of epitaxial silicon to meet the future product requirements of said wafer.

2. A method as in claim 1 which further comprises the step of, after said step of stripping, reestablishing said wafer's edge rounded contour.

3. A method reestablishing said wafer's edge rounded contour as in claim 2 wherein said step of reestablishing said wafer's edge contour is performed if the thickness of the original epitaxial layer is greater than approximately eight microns.

4. A method as in claim 2 wherein said step of reestablishing said wafer edge contouring precedes said step of repolishing said wafer's frontside.

5. A method as in claim 1 wherein said step of redistributing the oxygen induced defects follow the said step of repolishing.

6. A method as in claim 1 wherein said step of redistributing the oxygen induced defects comprises a first step of subjecting the wafer to an oxygen/ chlorine ambient.

7. A method as in claim 6 wherein said oxygen/chlorine ambient has a first temperature of greater than approximately 1,150° C.

8. A method as in claim 7 wherein said step of redistributing further comprises the step of subjecting said wafer to second temperature less than said first temperature, following said first step.

9. A method as in claim 8 wherein said second temperature is within the range of approximately 550° C. to 750° C.

10. A method as in claim 1 wherein said step of forming a fresh layer of epitaxial silicon comprises the step of growing said layer of epitaxial silicon on said wafer following said step of redistributing said oxygen induced defects.

* * * * *